United States Patent
Ji et al.

(10) Patent No.: US 7,929,588 B2
(45) Date of Patent: Apr. 19, 2011

(54) SEMICONDUCTOR DEVICES AND METHODS FOR GENERATING LIGHT

(75) Inventors: Chen Ji, San Jose, CA (US); Laura Giovane, Sunnyvale, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 169 days.

(21) Appl. No.: 12/359,309

(22) Filed: Jan. 24, 2009

(65) Prior Publication Data

US 2010/0189147 A1 Jul. 29, 2010

(51) Int. Cl.
  *H01S 5/00* (2006.01)
(52) U.S. Cl. .................. 372/45.01; 372/46.01
(58) Field of Classification Search .......... 372/75, 372/45.01, 46.01
  See application file for complete search history.

(56) References Cited

U.S. PATENT DOCUMENTS

| | | | |
|---|---|---|---|
| 5,468,656 A | 11/1995 | Shieh et al. | |
| 6,653,158 B2* | 11/2003 | Hall et al. | 438/22 |
| 6,680,963 B2* | 1/2004 | Liao et al. | 372/96 |
| 6,720,585 B1* | 4/2004 | Wasserbauer et al. | 257/98 |
| 6,816,527 B2* | 11/2004 | Ueki | 372/46.01 |
| 6,931,042 B2* | 8/2005 | Choquette et al. | 372/43.01 |

OTHER PUBLICATIONS

Chang, Y.H. et al., High Speed (> 13 GHZ) Modulation of 850 nm Vertical Cavity Surface Emitting Lasers (VCSELs) With Tapered Oxide Confined Layer, I.E.E.E. Proceedings-Optoelectronics, vol. 152, No. 3, Jun. 2005, pp. 170-173.

Liu, Yang et al., Effects of the Spatial Nonuniformity of Optical Transverse Modes on the Modulation Response of Vertical-Cavity Surface-Emitting Lasers, I.E.E.E. Journal of Quantum ELectronics, vol. 39, No. 1, Jan. 2003, pp. 99-108.

* cited by examiner

*Primary Examiner* — Minsun Harvey
*Assistant Examiner* — Tuan N. Nguyen

(57) ABSTRACT

Semiconductor devices and a method for generating light in a semiconductor device are invented and disclosed. The method includes the steps of forming a vertical cavity surface emitting laser including an active region and an oxide layer, the active region separated from the oxide layer and configured to generate light in response to an injected current and introducing an implant layer adjacent and underneath the oxide layer to confine the injected current to a region of the device where charge carriers are combining to generate light. The semiconductor devices include an implant layer between the oxide layer and the active region. The implant layer prevents lateral leakage current from exiting a region of the device where charge carriers are combining to generate light.

20 Claims, 6 Drawing Sheets

SEMICONDUCTOR DEVICES AND METHODS FOR GENERATING LIGHT

BACKGROUND

Direct modulated vertical cavity surface emitting lasers (VCSELs) have become a standard technology for applications in local area networks (LANs) and storage area networks (SANs). VCSELs provide a number of advantages including desirable threshold current, divergence angle, and beam configuration. The surface emission property of VCSELs allows the devices to be manufactured in two-dimensional arrays and enables wafer level testing. Thus, VCSEL devices are not only efficient in operation, they are also relatively easy to manufacture having a relatively low fabrication cost. These advantages make the VCSEL ideally suited for high-volume, low-cost and short-reach data communication links.

For optical communication applications, high-modulation bandwidth is desirable. Supportable data rates vary directly with modulation bandwidth. Currently, VCSELs are commercially available that can support a data rate of 10 Gb/sec. For the next generation VCSEL applications, data rates of 17 Gb/sec. and beyond are desired. Principal factors affecting data rates of VCSEL devices include the relaxation oscillation frequency, optical nonlinearities, and parasitic circuit effects. Parasitic circuit effects are the direct result of device resistance and capacitance. Accordingly, one key area of VCSEL design optimizations involves techniques for reducing resistance and minimizing capacitance in the VCSEL.

Generally, a semiconductor-based light emitting device, such as a VCSEL, is formed by epitaxially growing semiconductor material layers over a substrate. Conventional techniques for minimizing device resistance include optimization of device resistance by doping the various epitaxially grown semiconductor material layers. Existing VCSEL designs also include a relatively thick dielectric layer underneath a contact pad and an isolation implant to make the semiconductor material between the electrical contact and the active region of the VCSEL electrically insulating, which can reduce the parasitic capacitance associated with the contact pad to negligible values. Conventional VCSEL arrangements further include an oxide layer for optical index guiding and current confinement in the region where carriers combine within the VCSEL to generate light. Both the isolation implant and the oxide layer are formed from material compositions that insulate or confine the injected current within the VCSEL. A conventional VCSEL device is illustrated in FIG. 1.

The conventional VCSEL 10 is a semiconductor device with an active region 14 arranged between vertically-stacked mirrors, commonly known as distributed Bragg reflectors (DBRs) or Bragg mirrors. The active region 14 is adjacent to an n-type DBR 12 along a lower surface and a p-type DBR 18 along a portion of an upper surface of the active region 14. The active region 14 includes quantum wells (not shown) that generate light in the presence of an injected current in an amount that reaches or exceeds a threshold level or VCSEL threshold current. The quantum wells are composed of thin layers of semiconductor materials that differ in band-gap energy. Each DBR or mirror is a structure formed from multiple layers of alternating materials with varying refractive index. Each layer boundary causes a partial reflection of the light emitted from the active region 14. For light having a wavelength that is close to four times the optical thickness of the layers, the multiple reflections combine with constructive interference, and the layers form a high-quality reflector. To achieve a desired reflectivity, the number of semiconductor or dielectric layers constituting each of the DBRs can be quite large. An isolation layer 15 surrounds the p-type DBR 18 and is between a p-type metal contact 11 and an oxide layer 16. The isolation layer 15, which can be formed by implanting ions of hydrogen, oxygen or other elements, limits the contact surface at the junction of the p-type DBR 18 and the p-type metal contact 11 and separates the p-type metal contact 11 from the active region 14. A dielectric layer 13 arranged between the p-type metal contact 11 and the isolation layer 15 limits the amount of p-type metal material in the VCSEL 10 and further separates a portion of the p-type metal contact 11 from the active region 14. The oxide layer 16 is below the isolation layer 15 and extends laterally beyond the isolation layer 15 into the p-type DBR 18 towards the center of the VCSEL 10. A gap in the isolation layer 15 defines an isolation aperture 24, which corresponds to the width of the p-type DBR 18. A gap in the oxide layer 16 defines an aperture 20 through which injected current flows from the p-type DBR 18 to the active region 14. In addition, to confining current flow through the region of the VCSEL 10 defined by the aperture 20, the oxide layer 16 also has a different refractive index than the semiconductor materials used to form the p-type DBR 18. For example, the refractive index of the p-type DBR 18 can be approximately 3.2 and the refractive index of the oxide layer 16 may be approximately 1.5. As a result, the oxide layer 16 provides refractive index guiding in the lateral direction in the region 19 of the device labeled optical mode.

The oxide layer 16 may be formed by oxidizing a semiconductor material layer that includes a significant amount of an element that is readily oxidized. For example, aluminum (Al) is an element that is frequently added to a semiconductor material layer to promote oxidation of the aluminum-containing layer. Generally, to form an aluminum-oxide layer, an aluminum-containing semiconductor layer is grown, and then heated in an oxidizing atmosphere, such as an atmosphere with high water vapor content. The oxidizing atmosphere oxidizes the exposed areas of any material having significant aluminum content.

Current injected into the VCSEL 10, as illustrated by arrows 26, flows from the p-type metal contact 11 into the p-type DBR 18. The isolation layer 15 and the oxide layer 16 are non-conducting and channel the current towards the aperture 20 in the optical region 19. When the current injected into the VCSEL 10 exceeds a threshold current electrons and holes recombine and emit photons in the optical region 19. Light is emitted from a relatively small area on the surface of the VCSEL 10, directly above or below the active region 14. The VCSEL 10 emits the light generated in the active region 14 through one of the p-type DBR 18 or the n-type DBR 12, dependent on which has a reflectivity less than that of the other. In the illustrated embodiment, the reflectivity of the p-type DBR 18 is less than the reflectivity of the n-type DBR 12. Accordingly, light is emitted from the VCSEL 10 in the upward direction as indicated by the arrow 25.

As illustrated in FIG. 1, the oxide layer 16 is not in contact with the active region 14. A thicker oxide layer extending towards the active region 14 would reduce capacitance in the VCSEL 10 due to the significantly lower dielectric constant of the oxidized material compared to the dielectric constant of the other layers of the semiconductor. However, such relatively thick oxide layers incur excess scattering losses, which significantly reduce the efficiency and effectiveness of the device. A thicker oxide layer also introduces excess mechanical stress into the device resulting in poor long term reliability performance. For optimal performance, the oxide layer 16 is located at a null of the optical standing wave in the p-type DBR 18. Consequently, the VCSEL 10 includes a gap 17 between an uppermost surface of the active region 14 and a lowermost surface of the oxide layer 16. Generally, the gap 17 or vertical separation distance between the active region 14 and the oxide layer 16 is on the order of 2,000 to 3,000 angstroms. Although the gap 17 is relatively small, the gap 17 provides a lateral leakage path underneath the oxide layer 16 and above the active region 14. The lateral leakage current, represented by arrows 30, results in a charge-pumped region outside the optical region 19. The charge-pumped region outside the optical region 19 increases monotonically with the amount of injected current or charge into the VCSEL 10. Accordingly, the unintended charge storage outside the region 19 contributes to the junction capacitance of the VCSEL 10, which can limit the modulation bandwidth and the supportable data rate of a conventional VCSEL device.

Tapered oxide layers have been introduced to reduce scattering loss and nonlinear damping in VCSELs resulting from interaction between lateral carrier and photon distribution non-uniformities. A tapered oxide layer that is thinnest in the region 19 and thickest at the lateral edges of the VCSEL has been shown to improve modulation bandwidth.

SUMMARY

An embodiment of a light-emitting semiconductor device includes an active region, an oxide layer and an implant layer. The active region is arranged to generate light in response to an injected charge. The oxide layer is arranged to direct the injected charge into the active region. The implant layer is arranged between the oxide layer and the active region. The implant layer confines the injected charge to a region of the device where charge carriers combine to emit light.

An embodiment of a method for generating light includes the steps of forming a vertical cavity surface emitting laser including an active region and an oxide layer, the active region separated from the oxide layer and configured to generate light in response to an injected current and introducing an implant layer adjacent and underneath the oxide layer to confine the injected current to a region of the device where charge carriers are combining to emit light.

The figures and detailed description that follow are not exhaustive. The disclosed embodiments are illustrated and described to enable one of ordinary skill to make and use the claimed semiconductor devices and methods for generating light. Other embodiments, features and advantages of the devices and methods will be or will become apparent to those skilled in the art upon examination of the following figures and detailed description. All such additional embodiments, features and advantages are within the scope of the devices and methods as defined in the accompanying claims.

BRIEF DESCRIPTION OF THE FIGURES

The light-emitting semiconductor devices and methods for generating light can be better understood with reference to the following figures. The components within the figures are not necessarily to scale, emphasis instead being placed upon clearly illustrating the principles of preventing lateral leakage current from exiting a region of the device where charge carriers are combining to generate light. Moreover, in the figures, like reference numerals designate corresponding parts throughout the different views.

DETAILED DESCRIPTION

Figure 1:
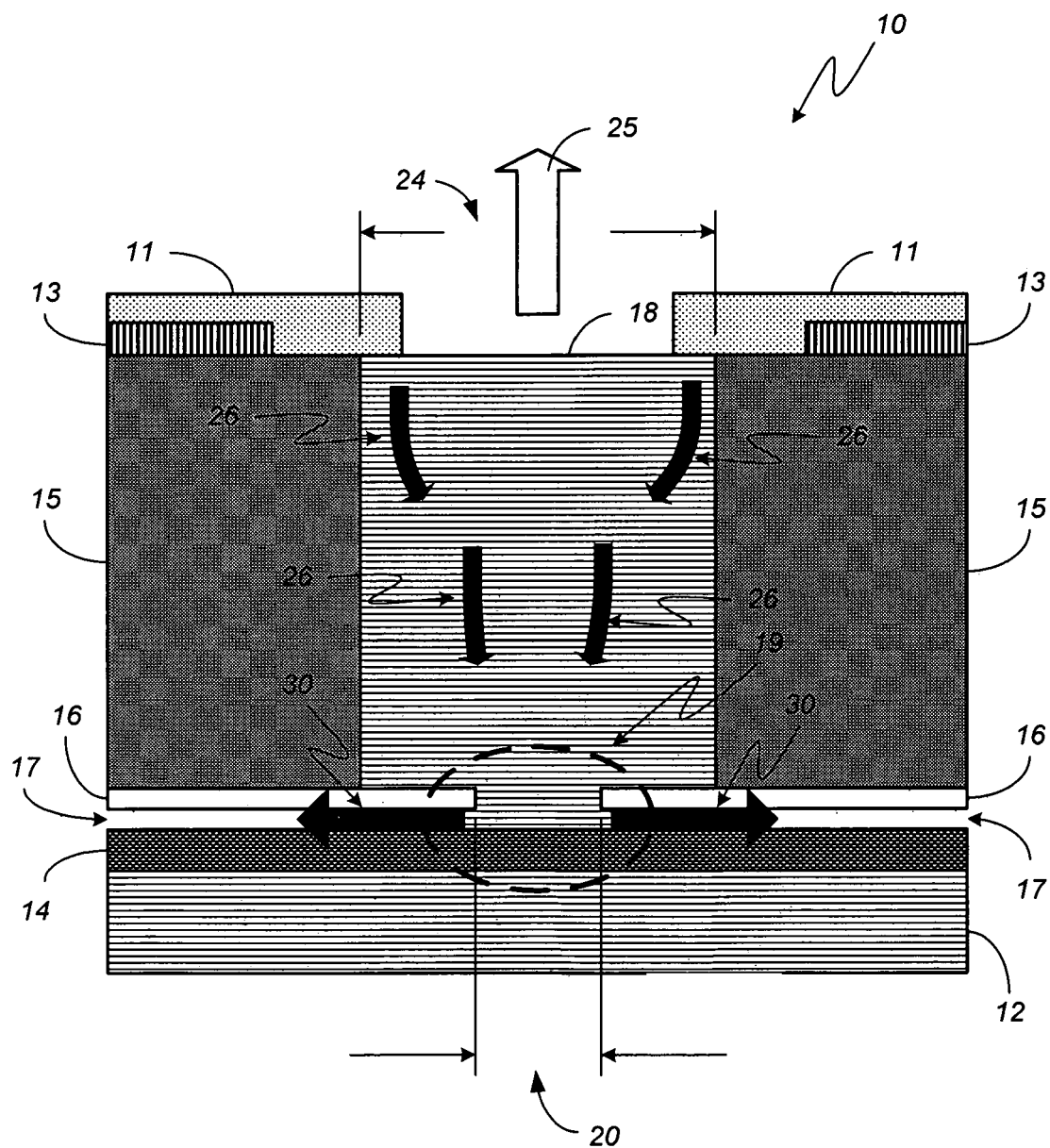
FIG. 1 is a cross-sectional plan view a conventional VCSEL device.

For commercially viable VCSEL designs, a relatively thick dielectric layer under a contact pad and an isolation implant are employed to optimize (i.e., reduce) device capacitance. Consequently, forward biased p-n junction capacitance is a limiting factor for VCSEL designs that employ an oxide layer. P-n junction capacitance is dependent on charge carriers at the p-n junction. When an injected current reaches or exceeds a threshold value, the VCSEL emits light. Theoretically, the charge carrier density in the active region of the VCSEL is clamped or limited for injected bias currents at or above the threshold current. However, it has been confirmed that p-n junction capacitance continues to increase monotonically with injected current for bias currents that exceed the threshold current. The lateral leakage current path underneath the oxide layer in conventional VCSEL designs leads to unintended charge storage outside of the region where charged carriers are combining to generate light. The charge carrier density in regions outside of the optical region (where the device is emitting light) is not clamped at laser threshold and results in increasing amounts of stored charge with increased biasing current. Tapered oxide layers, which have been introduced to reduce scattering loss and nonlinear damping in VCSELs do not prevent lateral leakage current. The unintended charge storage that results from the leakage current contributes to p-n junction capacitance. In combination, the leakage current with the associated non-linear damping effect resulting from interaction of non-uniform carrier and photon lateral distributions, and the increased p-n junction capacitance reduce the efficiency and limit the sustainable data rate and modulation bandwidth of the device.

The light-emitting semiconductor devices or improved VCSELs include an implant layer under an oxide layer. The implant layer includes implanted ions (e.g., hydrogen, oxygen, etc.) that make the layer an electrical insulator. In an embodiment the implant layer fills the void or gap between the lowermost surface of the oxide layer and the uppermost surface of the active region. In an alternative embodiment the implant layer extends vertically into the active region for a significant portion of the region underneath the oxide layer. Although the implant layers in the illustrated embodiments include an interface with the p-type DBR depicted with right angles, it should be understood that known techniques for implanting ions of a desired element produce a rounded edge at the interface of the p-type DBR. Integration of the implant layer prevents lateral leakage current from exiting the region of the device where charge carriers combine to generate light. The introduction of the implant layer under the oxide layer significantly reduces and stabilizes p-n junction capacitance for VCSEL devices being driven by bias currents that exceed the threshold current for a VCSEL. As will be explained in greater detail in association with the drawings, a decrease in implant aperture to a distance of about 13 μm (for a VCSEL with a nominal 9 μm oxide aperture) results in a corresponding decrease in p-n junction capacitance. In addition, introduction of the implant layer under the oxide layer reduces the threshold current by confining injected current to the region of device where charge carriers combine to generate light. Furthermore, introduction of the implant layer under the oxide layer reduces the non-linear damping effect resulting from interaction of non-uniform transverse optical and carrier populations, by confining the injected current to the central portion of the transverse optical field.

Figure 2:
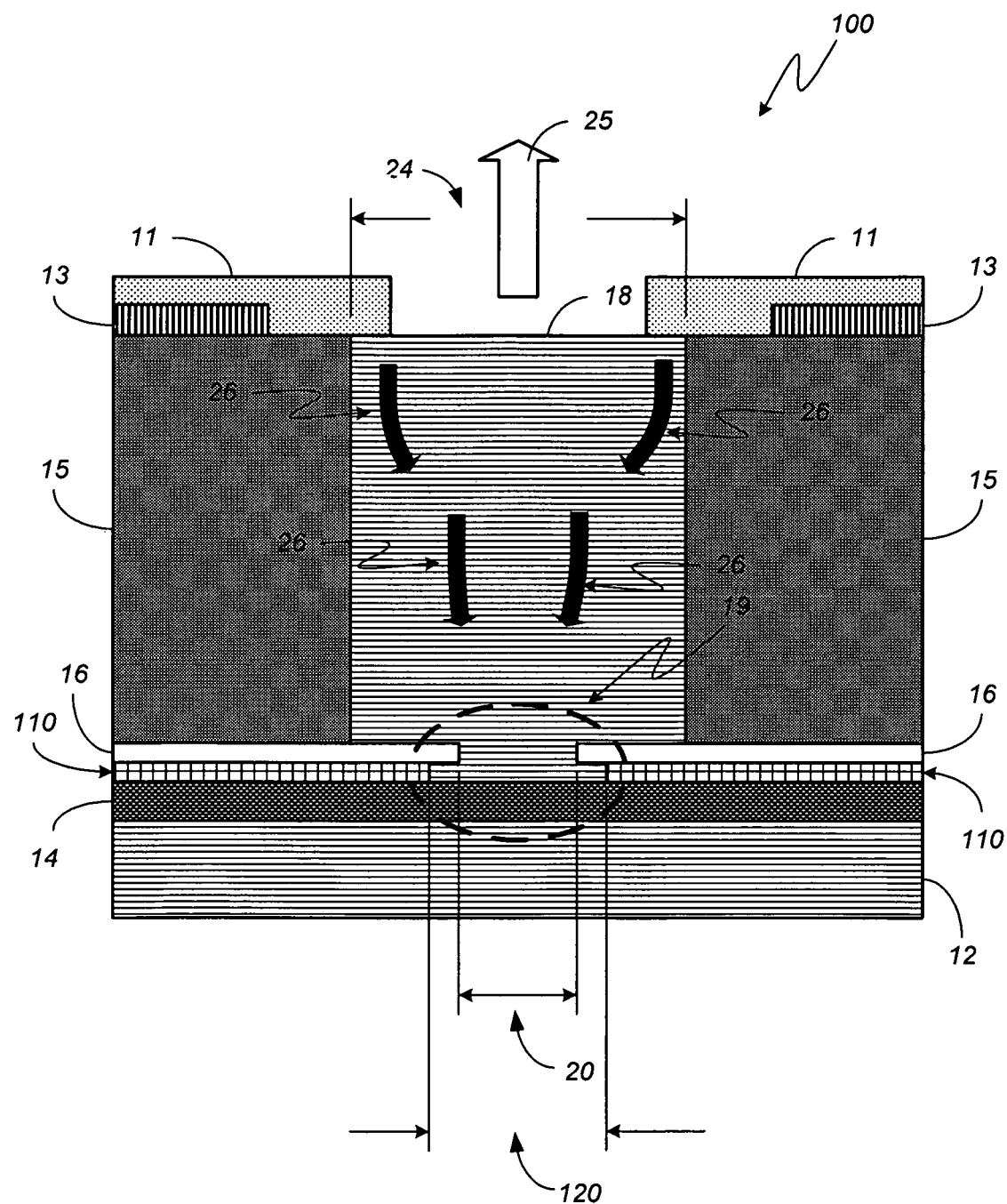
FIG. 2 is a cross-sectional plan view of an embodiment of an improved VCSEL device.

Turning now to the drawings, wherein like reference numerals designate corresponding parts throughout the drawings, reference is made to FIG. 2, which presents a cross-sectional plan view of an embodiment of an improved VCSEL device. The improved VCSEL 100 is a manufacturable semiconductor device that is constructed on a substrate or base (not shown) using conventional techniques (e.g., such as metal organic chemical vapor deposition (MOCVD), molecular beam epitaxy (MBE), chemical beam epitaxy (CBE), or the like.). Generally, the substrate is made of any suitable semiconductor material, such as gallium arsenide, indium phosphate, silicon, sapphire, or the like. In a preferred embodiment, the substrate is made of gallium arsenide, thereby facilitating subsequent growth of additional gallium arsenide and derivatives.

As illustrated in FIG. 2, the improved VCSEL 100 is constructed by forming an n-type DBR 12 on the substrate (not shown). The n-type DBR 12 is a structure that includes multiple layers of aluminum, gallium and arsenide that have been doped with a n-type element. Alternating layers within the n-type DBR 12 each have a varying refractive index. The specific arrangement (i.e., the number, thickness, material composition and refractive index) of the alternating layers within the n-type DBR 12 may change in accordance with specific applications and designs.

An active region 14 is formed above the n-type DBR 12. The active region 14 includes one or more quantum wells (not shown) made from thin layers of undoped aluminum, gallium and arsenide or other semiconductor material compositions that differ in band-gap energy. The specific arrangement (i.e., the number, thickness, material composition and band-gap energy) of the quantum wells within the active region 14 may change in accordance with specific applications and designs.

A p-type DBR 18 is formed above the active region 14. The p-type DBR 18 is a structure that includes multiple layers of aluminum, gallium and arsenide that have been doped with a p-type element. Alternate layers within the p-type DBR 18 each have a varying refractive index. The specific arrangement (i.e., the number, thickness, material composition and refractive index) of the alternating layers within the p-type DBR 18 may change in accordance with specific applications and designs.

The oxidation layer 16 is formed by deep etching a circular trench to expose a portion of a high aluminum-content layer within the p-type DBR 18. Aluminum is an element that is readily oxidized. The oxide layer 16 is exposed and then heated to an elevated temperature in an oxidizing atmosphere, such as an atmosphere with high water vapor content. The oxidizing atmosphere oxidizes the exposed areas of any material having significant aluminum content. The specific arrangement (i.e., the oxide aperture, thickness and material composition) of the oxide layer 16 may change in accordance with specific applications and designs. In an example embodiment, the oxide layer consists essentially of $Al_xGa_{1-x}As$, where $x \geq 0.9$.

An isolation layer 15 is created such that the p-type DBR 18 above the oxide layer 16 is surrounded by the isolation layer 15. The isolation layer 15 is formed by implanting ions of hydrogen, oxygen, boron or other suitable elements into the alternating layers of the p-type DBR 18. The isolation layer 15 extends into the p-type DBR 18 to define an isolation aperture 24. After implantation, the isolation layer 15 is electrically insulating. In the illustrated embodiment, the isolation layer 15 extends from the uppermost surface of the p-type DBR 18 to the lowermost surface of the p-type DBR 18. The specific arrangement (i.e., the ion type, and ion density) of the isolation layer 15 may change in accordance with specific applications and designs.

Thereafter, the implant layer 110 is formed by implanting ions of hydrogen, oxygen, boron or other suitable elements into a semiconductor material such as a composition of aluminum, gallium, and arsenide. In a preferred embodiment, hydrogen ions are implanted with an energy and dose such that hydrogen ions penetrate the first portion of the p-type DBR 18 outside the implant aperture to the uppermost surface of the active region 14. The specific arrangement (i.e., the thickness, ion type, and ion density) of the implant layer 110 may change in accordance with specific applications and designs.

Dielectric layer 13 is formed on the uppermost surface of the isolation layer 15. Dielectric layer 13 is made of any suitable dielectric material, such as silicon dioxide ($SiO_2$), silicon nitride ($Si_3N_4$), or the like. Dielectric layer 13 is formed using any suitable method or technique, such as chemical vapor deposition (CVD), e.g., low-pressure chemical vapor deposition (LPCVD), plasma-enhanced chemical vapor deposition (PECVD). The specific arrangement (i.e., thickness and length) of dielectric layer 13 may change in accordance with specific applications and designs.

P-type metal contact 11 is formed above the dielectric layer 13 and the isolation layer 15. The p-type metal contact 11 is made from any p-type metal. The p-type metal contact 11 is deposited on the dielectric layer 13 and the isolation layer 15 by any suitable method or technique, such as sputtering, evaporation, and the like. Additionally, it should be understood that specific thicknesses of the p-type metal contact 11 can change with specific applications and designs.

The VCSEL 100 is a manufacturable structure that includes an implant layer 110 between the oxide layer 16 and the active region 14. The implant layer 110 extends into the p-type DBR 18 towards the center of the VCSEL 100. A gap in the implant layer 110 defines an aperture 120 through which injected current flows from the p-type DBR 18 to the active region 14. As described above, the implant layer 110 includes a semiconductor material with implanted ions (e.g., hydrogen, oxygen, etc.) that make the implant layer 110 an electrical insulator. In the illustrated embodiment, the implant layer 110 extends into the optical region 19 and is in contact with the lowermost surface of the oxide layer 16 and the uppermost surface of the active region 14. The implant layer 110 laterally extends into the p-type DBR 18 further than the isolation layer 15 but not as far as the oxide layer 16. As illustrated in FIG. 2, the isolation aperture 24 is larger than the gap or opening in the p-metal contact 11 to permit current to be injected into the p-type DBR 18. Current is injected into the VCSEL 100 from the portion of the p-metal contact 11 that contacts the p-type DBR 18. In addition, the gap or opening in the p-metal contact 11 is larger than the oxide aperture 20 to prevent possible interference with any optical emission from the VCSEL 100. The implant aperture 120 is not limited by these constraints, and can be arbitrarily small and close to the oxide aperture dimension. Accordingly, other physical relationships of the implant layer 110 are possible and contemplated.

In operation, current injected into the VCSEL 100, as illustrated by arrows 26, flows from the p-type metal contact 11 into the p-type DBR 18. The isolation layer 15 and the oxide layer 16 are non-conducting and channel the current towards the oxide aperture 20 and the implant aperture 120 in the optical region 19. When the current injected into the VCSEL 100 exceeds a threshold current electrons and holes recombine and emit photons in the optical region 19. In the illustrated embodiment, the reflectivity of the p-type DBR 18 is less than the reflectivity of the n-type DBR 12. Accordingly, light is emitted from the VCSEL 100 in the upward direction as indicated by the arrow 25. The VCSEL 100 is structured to generate light having a wavelength of approximately 850 nm. In alternative embodiments, a VCSEL including both the oxide layer 16 and the implant layer 110 can be arranged to generate and emit light having a wavelength from about 620 nm to about 1080 nm, and output directly either upward or downward through a substrate transparent to the emission wavelength.

In operation, the implant layer 110 of the VCSEL 100 prevents the leakage current 30 (FIG. 1) from creating a charge pumped reservoir of carriers outside the optical region 19. Experimental observation indicates that for a constant bias current, small-signal modulation bandwidth is improved by the integration of the implant layer 110 with the smallest implant aperture 120 showing the most improvement.

Figure 3:
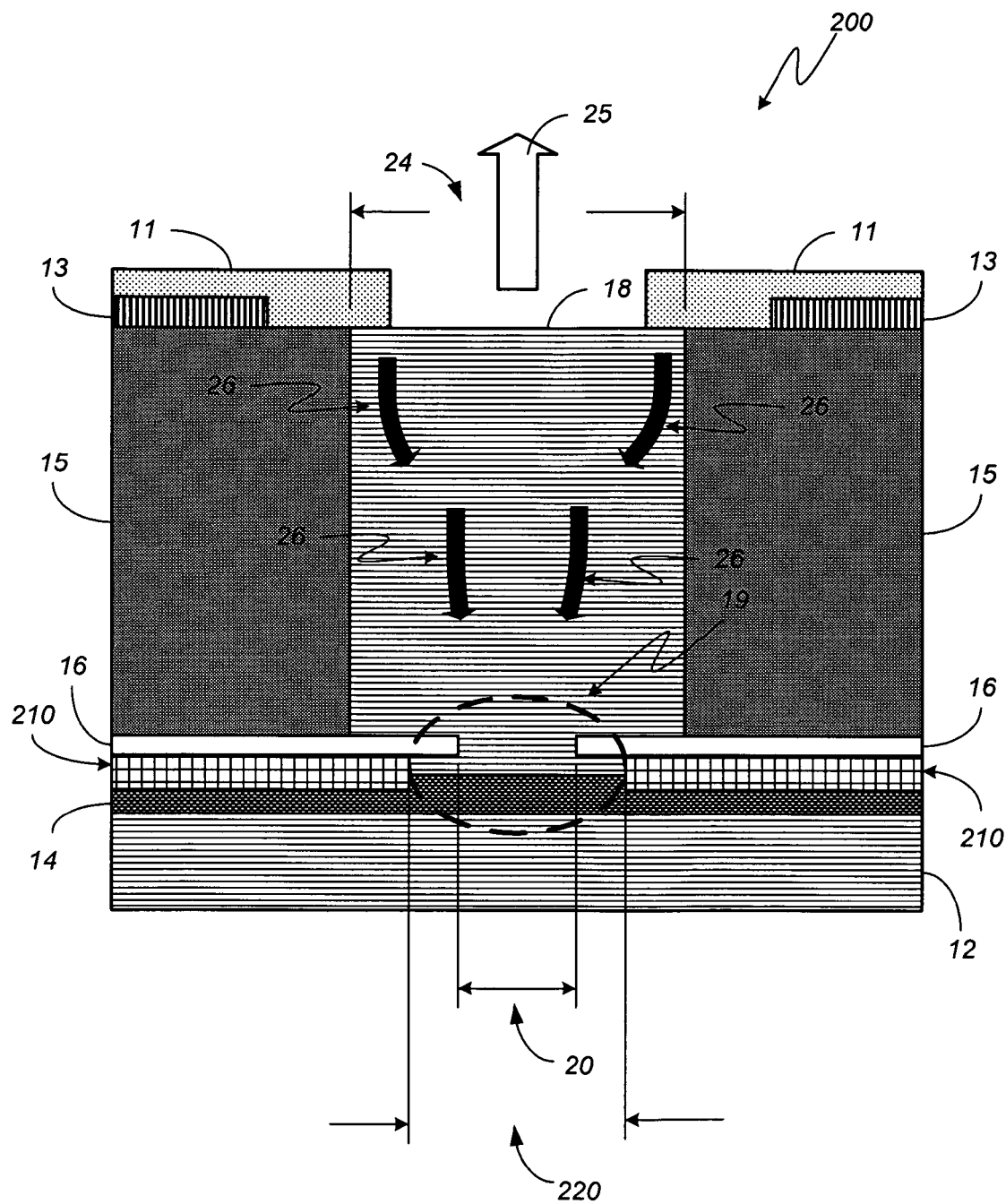
FIG. 3 is a cross-sectional plan view of an alternative embodiment of an improved VCSEL device.

FIG. 3 is a cross-sectional plan view of an alternative embodiment of an improved VCSEL device. The VCSEL 200 is a manufacturable structure that includes an implant layer 210 under the oxide layer 16 and extending vertically into the active region 14. The implant layer 210 extends laterally into the p-type DBR 18 towards the center of the VCSEL 200. A gap in the implant layer 210 defines an aperture 220 through which injected current flows from the p-type DBR 18 to the active region 14. As described above, the implant layer 210 includes implanted ions (e.g., hydrogen, oxygen, boron etc.) that make the implant layer 210 an electrical insulator. In the illustrated embodiment, the implant layer 210 extends to the edge of the optical region 19 and is in contact with the lowermost surface of the oxide layer 16. In addition to having a larger aperture than the VCSEL 100 (FIG. 2), the implant layer 210 encroaches into the active region 14. In alternative embodiments (not shown), the implant layer 210 may extend as far as or even into the n-type DBR 12 to prevent injected current from escaping from the optical region 19 of the VCSEL 200.

In operation, that is in the presence of an injected current that exceeds the threshold current of the VCSEL 200, the implant layer 210 of the VCSEL 200 prevents the leakage current 30 (FIG. 1) from creating a charge pumped reservoir of carriers outside the optical region 19. As a result, the injected current 26 is confined to the optical region 19, and both the threshold current and junction capacitance are reduced.

Other approaches (not shown) may achieve a similar lateral current confinement in the optical region 19. For example, one could grow an intrinsic semiconductor layer (undoped and insulating) between the oxide layer 16 and the active region 14, then selectively make the material in the oxide aperture conducting, such as through a deep diffusion process using Zinc (i.e., doping with Zinc to make the material conductive). However, such designs may prove to be very difficult to manufacture.

Figure 4:
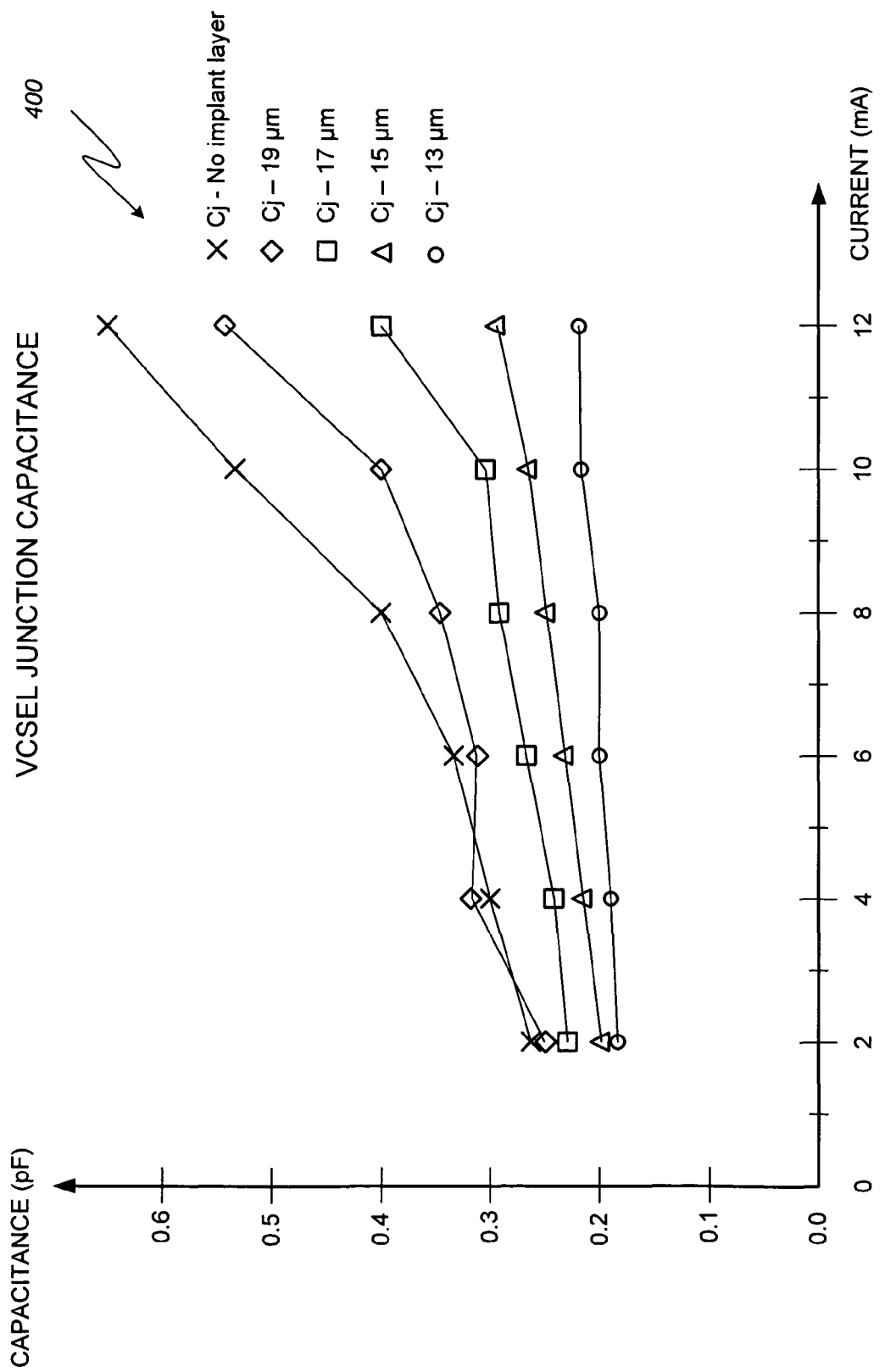
FIG. 4 is a plot illustrating junction capacitance and bias current in a control device and for various arrangements of the implant aperture in the improved VCSEL device of FIG. 2.

FIG. 4 is a plot illustrating junction capacitance and bias current in a control device and for various arrangements of the implant aperture in the improved VCSEL device of FIG. 2. The plot 400 includes junction capacitance in pF along a vertical axis and bias or injected current in mA along a horizontal axis. The junction capacitance for a control device, that is, a VCSEL without an implant layer 110, 210 is depicted by the line defined by data points illustrated with an "x." The junction capacitance for an example device, that is, a VCSEL with an implant layer 110, 210 having an implant aperture 120, 220 of about 19 µm is depicted by the line marked with data points illustrated by a symbol in the shape of a diamond. The junction capacitance for an example device, that is, a VCSEL with an implant layer 110, 210 having an implant aperture 120, 220 of about 17 µm is depicted by the line marked with data points illustrated by a symbol in the shape of a square. The junction capacitance for an example device, that is, a VCSEL with an implant layer 110, 210 having an implant aperture 120, 220 of about 15 µm is depicted by the line marked with data points illustrated by a symbol in the shape of a triangle. The junction capacitance for an example device, that is, a VCSEL with an implant layer 110, 210 having an implant aperture 120, 220 of about 13 µm is depicted by the line marked with data points illustrated by a symbol in the shape of a circle. It is clear from the plot 400 that junction capacitance is significantly reduced for each of the example VCSELs that were produced and tested with a VCSEL arranged with an implant aperture of approximately 13 µm showing the most improvement.

Figure 5:
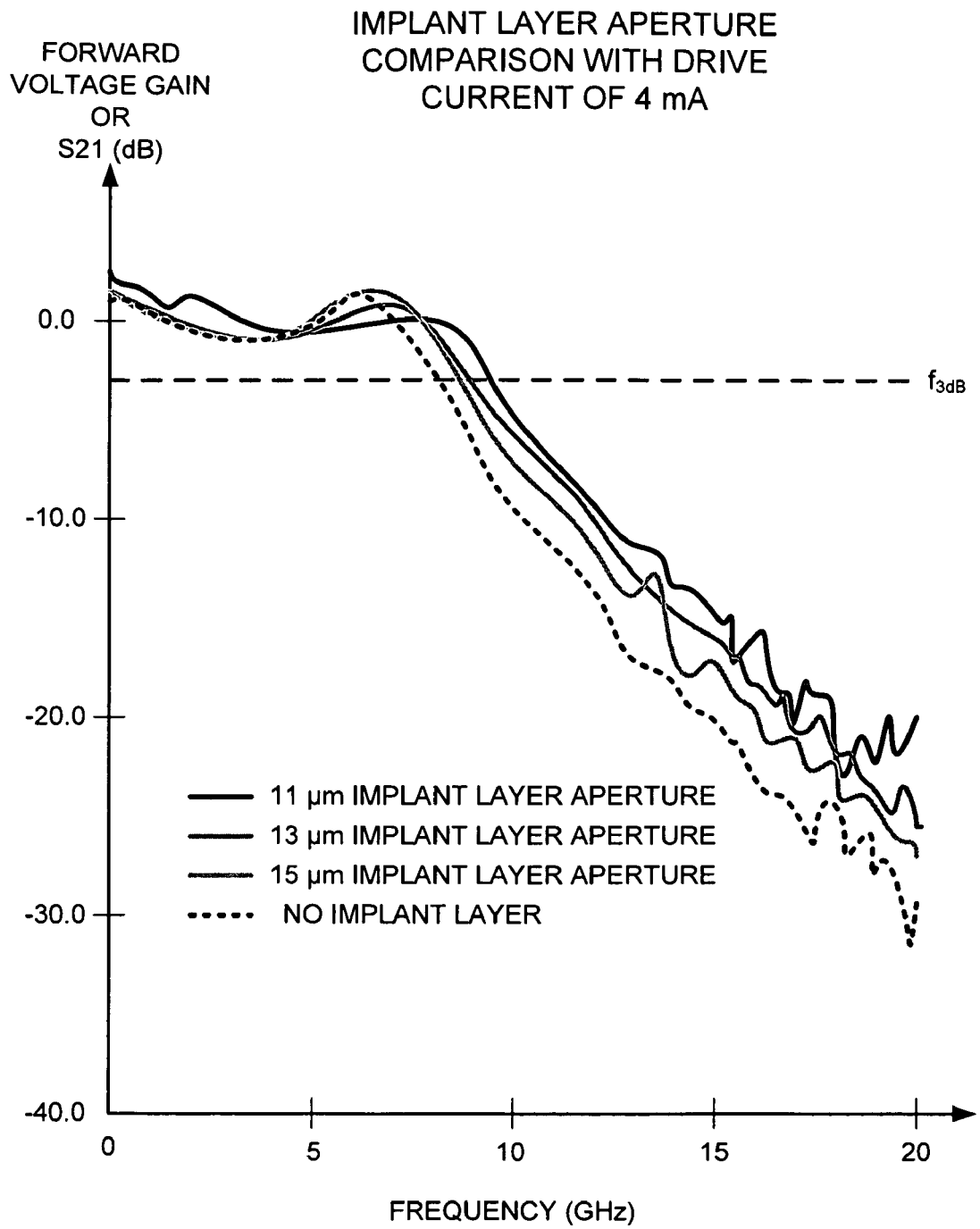
FIG. 5 is a plot illustrating small signal modulation bandwidth for select arrangements of the implant aperture in the improved VCSEL device of FIG. 2.

FIG. 5 is a plot illustrating small signal modulation bandwidth for select arrangements of the implant aperture in the improved VCSEL device of FIG. 2. The plot 500 includes forward voltage gain or scatter parameter S21 in decibels along a vertical axis and frequency in GHz along a horizontal axis. The forward voltage gain for a control device, that is, a VCSEL without an implant layer 110, 210 being driven by a bias current of approximately 4 mA is depicted by the dashed line. The forward voltage gain for an example device, that is, a VCSEL with an implant layer 110, 210 having an implant aperture 120, 220 of about 15 µm is depicted by the light grey line. The forward voltage gain for an example device, that is, a VCSEL with an implant layer 110, 210 having an implant aperture 120, 220 of about 13 µm is depicted by the dark grey line. The forward voltage gain for an example device, that is, a VCSEL with an implant layer 110, 210 having an implant aperture 120, 220 of about 11 µm is depicted by the black line. It is clear from the plot 500 that forward voltage gain or S21 is significantly improved for each of the example VCSELs that were produced and tested with a VCSEL arranged with an implant aperture of approximately 11 µm showing the most improvement. An improved forward voltage gain is directly relatable to an improved modulation bandwidth and sustainable data rate for a communication link that uses the improved VCSEL 100, 200. The modulation bandwidth improvement for the 11 µm case is a result of the above mentioned benefits of the deep-implant process, including reduced threshold current, reduced charge storage outside the optical mode with lessened device parasitics penalty, and reduced non-linear optical interaction between the lateral optical and carrier distribution non-uniformities through the improved lateral confinement of the carrier population.

Figure 6:
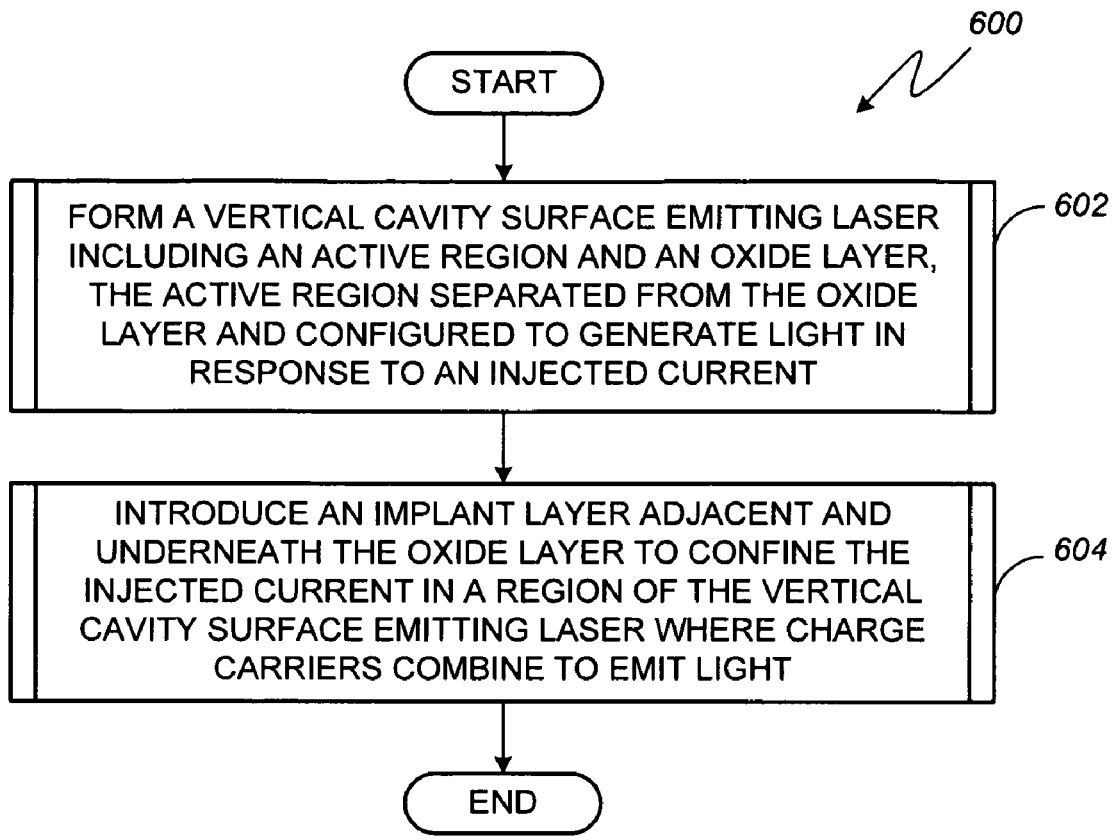
FIG. 6 is a flow chart of an embodiment of a method for generating light.

FIG. 6 is a flow chart of an embodiment of a method 600 for generating light. The method begins with block 602 where a vertical cavity surface emitting laser or VCSEL is formed. The VCSEL includes an active region and an oxide layer. The active region is separated from the oxide layer and is configured to generate light in response to an injected current. In block 604, an implant layer is introduced underneath the oxide layer to confine injected current in a region of the VCSEL where charge carriers combine to generate light.

As shown above, the oxide layer 16 is underneath an isolation layer 15 and extends laterally into a p-type DBR 18 above the active region 14. In alternative embodiments, the implant layer 110, 210 may extend into or through the active region 14 underneath the oxide layer 16. In other alternative embodiments (not shown), the implant layer 110, 210 may extend vertically into the n-type DBR 12. The implant layer 110, 210, which can be formed by implanting ions of a species of an element such as hydrogen, oxygen, boron, etc. make the implant layer 110, 210 electrically insulating and confine injected current in an optical region 19 where light is generated.

While various embodiments of the light-emitting semiconductor devices and methods for generating light have been described, it will be apparent to those of ordinary skill in the art that many more embodiments and implementations are possible that are within the scope of this disclosure. Accordingly, the described semiconductor devices and methods for generating light are not to be restricted or otherwise limited except in light of the attached claims and their equivalents.

What is claimed is:

1. A light-emitting semiconductor device, comprising:
   an active region between an n-type distributed Bragg reflector and a p-type distributed Bragg reflector, the active region arranged to generate light in response to an injected charge introduced by a current flowing from an electrical contact coupled to the p-type distributed Bragg reflector;
   an oxide layer in contact with the p-type distributed Bragg reflector and opposed to the electrical contact, the oxide layer having an oxide layer aperture that directs the injected charge into the active region; and
   an implant layer arranged between the oxide layer and the active region, the implant layer formed by implanting ions of a non-semiconductor element into a semiconductor material to make the implant layer an electrical insulator, the implant layer having an implant layer aperture that directs the injected charge to a region of the device where charge carriers are combining to emit light, the implant layer aperture being between about 20% to 110% larger than the oxide layer aperture.

2. The device of claim 1, wherein the implant layer extends into the p-type distributed Bragg reflector towards the center of the device.

3. The device of claim 2, wherein the oxide layer extends into the p-type distributed Bragg reflector towards the center of the device further than the implant layer.

4. The device of claim 1, wherein the implant layer contacts an upper surface of the active region.

5. The device of claim 1, wherein the implant layer extends vertically into the active region.

6. The device of claim 1, wherein the implant layer forms an aperture of about 11 micrometers to 15 micrometers.

7. The device of claim 1, wherein the semiconductor material of the implant layer comprises aluminum, gallium, and arsenide.

8. The device of claim 7, in which the oxide layer consists essentially of $Al_xGa_{1-x}As$, where $x \geq 0.9$.

9. The device of claim 1, structured to generate light having a wavelength between 620 nm and 1650 nm.

10. The device of claim 9, structured to generate light having a wavelength of approximately 850 nm.

11. A method for generating light, the method comprising:
    forming a vertical cavity surface emitting laser including an active region and an oxide layer, the active region separated from the oxide layer, the active region between an n-type distributed Bragg reflector and a p-type distributed Bragg reflector and configured to generate light in response to an injected current flowing from an electrical contact coupled to the p-type distributed Bragg reflector, the oxide layer having an oxide layer aperture that directs the injected current into the active region; and
    injecting ions of an element that is an electrical insulator into a semiconductor material adjacent to the oxide layer to form an implant layer adjacent the oxide layer, the implant layer confining the injected current to a region of the device where charge carriers are combining to emit light, the implanted layer aperture being between about 20% to 110% larger than the oxide layer aperture.

12. The method of claim 11, wherein the semiconductor material comprises Aluminum, Gallium, and Arsenide.

13. The method of claim 11, wherein injecting ions of an element that is an electrical insulator into a semiconductor material to form an implant layer comprises extending the implant layer into the p-type distributed Bragg reflector.

14. The method of claim 13, wherein extending the implant layer into the p-type distributed Bragg reflector results in less penetration of the p-type distributed Bragg reflector by the implant layer than penetration due to the oxide layer.

15. The method of claim 11, wherein injecting ions of an element that is an electrical insulator into a semiconductor material to form an implant layer comprises extending the implant layer vertically in the direction of the active region.

16. The method of claim 11, wherein injecting ions of an element that is an electrical insulator into a semiconductor material to form an implant layer comprises extending the implant layer vertically into the active region.

17. The method of claim 11, wherein injecting ions of an element that is an electrical insulator into a semiconductor material to form an implant layer comprises introducing a sufficient distribution of ions to make the implant layer react to injected current like an electrical insulator.

18. The method of claim 11, wherein injecting ions of an element that is an electrical insulator into a semiconductor material to form an implant layer comprises blocking lateral leakage of the injected current under the oxide layer.

19. The method of claim 11, further comprising:
    adjusting an implant aperture to vary a signal modulation bandwidth.

20. The method of claim 11, wherein forming a vertical cavity surface emitting laser comprises structuring quantum wells to generate light having a wavelength of approximately 850 nm.

* * * * *